United States Patent
Gillard et al.

(10) Patent No.: US 7,086,653 B2
(45) Date of Patent: Aug. 8, 2006

(54) TRANSFERABLE CAMMED GASKET

(75) Inventors: Edward Charles Gillard, Mantorville, MN (US); Don Alan Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 10/988,233

(22) Filed: Nov. 12, 2004

(65) Prior Publication Data

US 2006/0103080 A1    May 18, 2006

(51) Int. Cl.
   *F16J 15/02*    (2006.01)

(52) U.S. Cl. .................. 277/630; 277/637; 277/650; 277/653; 277/920; 277/919; 277/644; 361/816; 174/35 GC

(58) Field of Classification Search ................ 277/328, 277/630, 637, 640, 648–650, 653, 919, 920, 277/644; 361/816, 818; 175/35 C; 174/35 R, 174/35 GC See application file for complete search history.

(56) References Cited

U.S. PATENT DOCUMENTS

| | | | | | |
|---|---|---|---|---|---|
| 4,823,229 | A | * | 4/1989 | Waterland, III | ............. 361/218 |
| 5,120,903 | A | * | 6/1992 | Tam | ....................... 174/35 GC |
| 6,294,729 | B1 | * | 9/2001 | Kaplo | .................... 174/35 GC |
| 2004/0094904 | A1 | * | 5/2004 | Grant | .......................... 277/628 |

* cited by examiner

*Primary Examiner*—Suzanne Dino Barrett
*Assistant Examiner*—Gilbert Lee
(74) *Attorney, Agent, or Firm*—Robert W. Lahtinen

(57) ABSTRACT

The transferrable EMI gasket assembly utilizes a carrier with a pair of arms, each attached to a back panel by a hinged connection and extending in the same direction to overlie one another. The conductive, deformable gasket material is attached to the carrier and positioned adjacent the back panel. The assembly is collapsed for installation with the back panel overlying one of the arms hinged thereto to present a reduced height. The assembly is placed in the operative position by moving one arm relative to the other to pivot the carrier back panel to a near right angle position with respect to the carrier arms. In the operative position, the gasket material is compressed and deformed against the confronting surfaces to effect the EMI seal while the biasing force of the compressed gasket material, in the preferred embodiment, secures the carrier arms together.

16 Claims, 4 Drawing Sheets

US 7,086,653 B2

TRANSFERABLE CAMMED GASKET

FIELD OF THE INVENTION

This invention relates to gaskets and more particularly to a gasket assembly for suppressing electromagnetic interference (EMI) which may be easily installed and removed.

BACKGROUND OF THE INVENTION

Enclosures or cabinets for electronic equipment are commonly fabricated of metal to provide a supporting enclosure which also forms a continuous grounded conductive surface that affords electromagnetic compatibility (EMC) compliance. It is also occasionally necessary to interrupt the continuous conductive enclosure surface. One example is the mounting of storage devices in electronic equipment which must be accessible from the enclosure exterior for the insertion and removal of storage media such as disk drives or tape drives used in information handling devices. Although the devices mounted at the cabinet opening are enclosed in metal or otherwise conductive housings to preclude EMI problems, spaces can exist between adjoining devices which must be sealed for EMC purposes, The EMI gasket between adjacent components must provide a continuous seal against both confronting component surfaces and make an adequate contact to ground any charges intercepted by the gasket. In addition, the gasket assembly must be easy to install or remove to accommodate servicing the electronic equipment. Since devices installed at the enclosure cabinet opening may occasionally be removed for service or replacement, the gasket assembly must be capable of easy removal and reinstallation without compromising the gasket function.

A problem often arises wherein the compressive force of the gasket against the confronting surface which is effective to form an adequate seal is greater than the force that is acceptable for assembly and disassembly. Assembly and disassembly must be enabled without compromising optimum design force and required sealing effectiveness.

SUMMARY OF THE INVENTION

The EMI gasket assembly of the present invention includes a carrier attached to a strip of flexible, conductive gasket material. The carrier is formed of a rigid back panel to which upper and lower rigid arms are connected by hinge portions. The carrier may be formed of a single piece of plastic with integral hinge portions connecting the arms to the back panel or may comprise separate parts which are connected by tape or other means to achieve the hinged connection. The hinged carrier enables the gasket assembly to have a collapsed condition for installation and an operative and locked condition with the margins of the gasket material compressed against the confronting surfaces.

The gasket assembly is installed in the opening between two devices with the gasket material laying back, generally parallel with the arm members. In this condition the assembly can easily be inserted into the space between adjoining devices. When inserted to the desired position, the upper arm of the gasket assembly is moved forward and locked beneath a lip formed at the margin of the lower arm securing the upper arm to the lower arm. This process cams the carrier back panel and the gasket secured thereto toward a vertical position which urges the marginal surfaces of the gasket material against the confronting device surfaces with a compressive force sufficient to electrically seal the area between the devices and prevent EMI emissions. The gasket assembly is designed with the relative lengths of the upper and lower arms so related as to allow the upper arm to be moved to a locked position without the back panel reaching a vertical position with respect to the lower arm. Thus, the gasket material is not only compressed against the device surfaces, but also provides the biasing force to retain the upper arm in the locked position in the groove beneath the lip formed on the lower arm. The gasket assembly can then be moved to the final position with the end tabs formed on the carrier lower arm engaging the enclosure frame to limit the distance of penetration of the gasket assembly into the space between the devices.

To remove the gasket assembly from the installed position, a hole in the upper arm is engaged to slide the upper arm back, releasing the edge from the lower arm lip and thereafter moving the upper arm forward to rotate the back panel to the position generally parallel to the lower arm which collapses the carrier, decompresses the gasket material and permits easy removal of the assembly.

DETAILED DESCRIPTION

Figure 1:
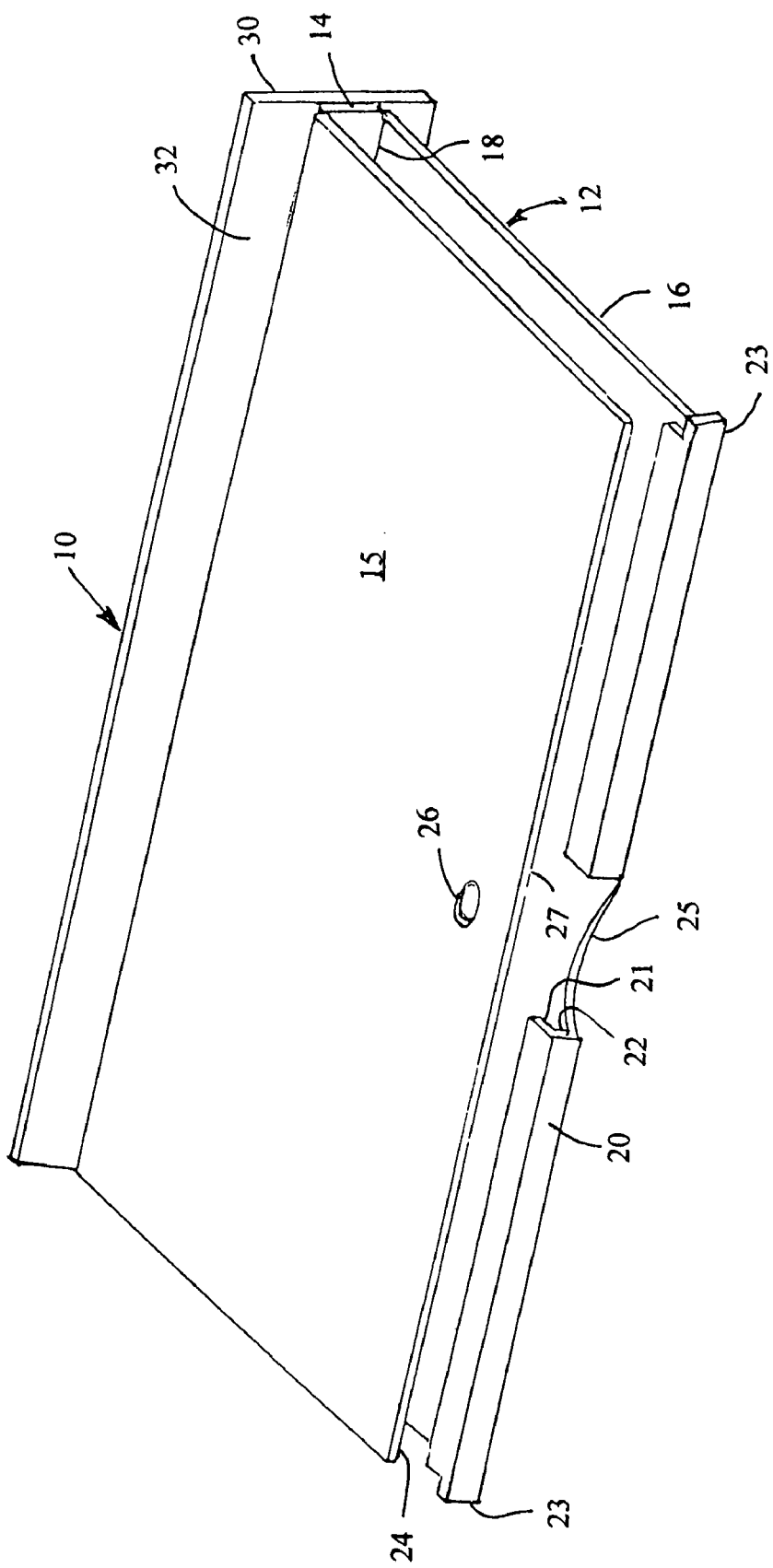
FIG. 1 is an isometric view of the preferred embodiment of the EMI gasket assembly of the present invention.

Referring to FIG. 1, the EMI gasket assembly 10 includes a carrier 12 which has a back panel 14 and a pair of arms, upper arm 15 and lower arm 16 that are attached to back panel 14 by hinged connections 18. Carrier 12, in a preferred embodiment, is formed as a single part of molded plastic with back panel 14 and upper and lower arms 15 and 16 being substantially rigid and the hinged connections 18 formed by a reduced thickness, molded hinge or living hinge portions. Alternatively, the back panel and arms could be formed as separate pieces which are connected by tape or other appropriate means to create the hinged connections.

Lower arm 16 includes an end wall 20 and a lip 21 which forms a groove 22 capable of receiving the marginal edge 24 of upper arm 15 when the gasket assembly 10 is placed in the operative condition. The lip is interrupted at the center and a recess 25 is formed in the lower arm to facilitate installation and removal of the gasket assembly. The upper arm 15 has an opening 26 adjacent the edge 27 remote from the back panel 14 and aligned with the lower arm recess 25 which enables a tool to install the upper arm marginal edge 24 in the lower arm groove 22 as the gasket assembly is installed and to remove the upper arm marginal edge from the lower arm groove 22 to allow the gasket assembly to be collapsed and removed from the installed location. Lower arm end wall 20 has projecting stop tabs 23 at each end which project beyond the length of the gasket assembly 10 which can function to position or limit the distance the gasket assembly is inserted, during installation, as the stop tabs engage cooperating structure presented by the enclosure with which the gasket assembly is used.

The EMI shielding is effected by a flexible strip 30 of conductive material which is attached to the rear surface of the back panel 14 along a midportion of major surface 32. The flexible strip must provide a continuous conductive surface and also possess sufficient stiffness and elasticity to form an EMI seal with the surfaces against which it is deformed and compressed in the operative position. The elasticity also provides the biasing force to urge upper arm edge 24 into lower arm groove 22 and maintain the gasket assembly in the installed position between generally parallel confronting surfaces. The flexible strip 30 may take many forms from a conductive strip which includes metal particles to a composition of a strip of flexible plastic with a conductive coating. A preferred embodiment used to implement the invention is a strip of foam plastic which has a covering of woven nickel fabric.

Figure 2:
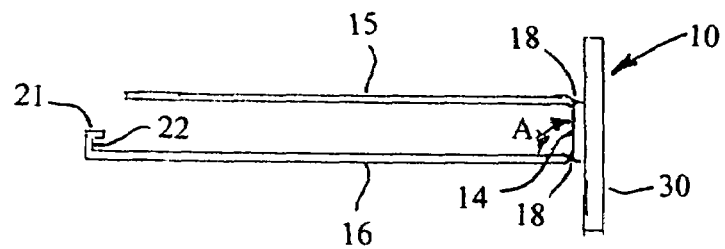
FIG. 2 is a side elevation of the EMI gasket assembly of FIG. 1.
Figure 3:
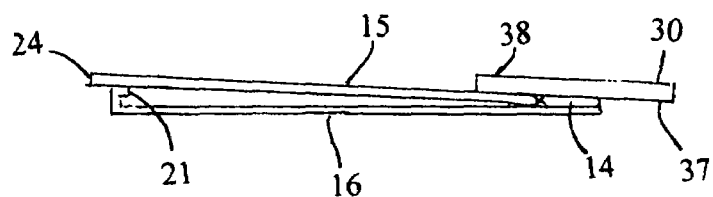
FIG. 3 is a side elevation of the gasket assembly of FIG. 1, showing the assembly collapsed to reduce the overall height for insertion to an operating location.
Figure 4:
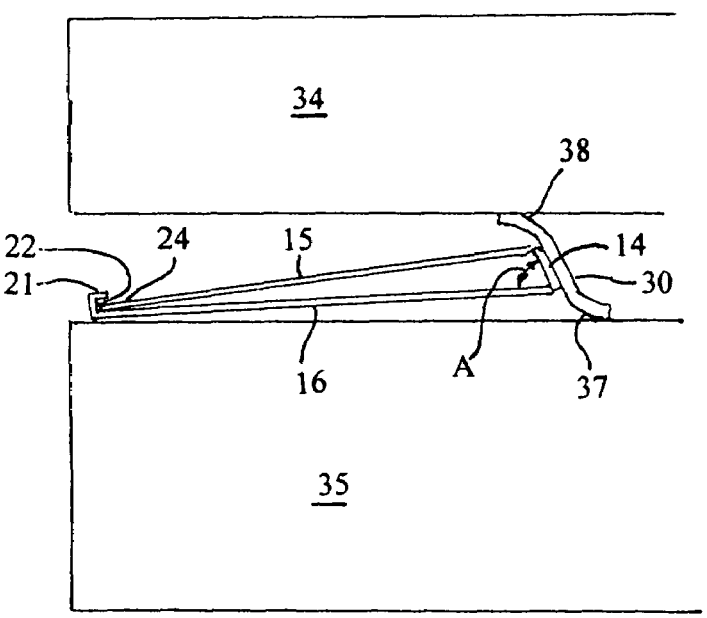
FIG. 4 is a side elevation of the gasket assembly of FIG. 1, showing the assembly in the operative position with the gasket compressed against the confronting surfaces of adjacent devices.

Referring to FIGS. 2, 3, and 4, FIG. 2 shows a side elevation of the gasket assembly 10 of FIG. 1. Upper arm 15 and lower arm 16 extend from back panel 14 to which they are connected by reduced thickness hinge portions 18 and the conductive flexible strip 30 is adhered to back panel 14. FIG. 3 shows the gasket assembly 10 collapsed with the back panel 14 folded back against the lower arm 16, reducing the height of the assembly for easy insertion between adjoining components which create the space requiring sealing for EMC. With the gasket assembly 10 in the collapsed condition of FIG. 3, the upper arm 15 extends beyond the lip 21 at the edge of lower arm 16. The gasket assembly 10, in the collapsed condition, may be inserted between adjoining components. In FIG. 4, adjoining components 34 and 35 are shown with an intervening space that must be sealed to prevent EMI. The gasket assembly 10 is positioned between components 34 and 35 in the collapsed condition of FIG. 3 With the gasket assembly 10 positioned in the space between adjoining components 34 and 35, which is to be sealed, the upper arm is moved relative to the lower arm to the position whereat the edge 24 is beyond the lower arm lip and allowed to be captured in the groove 22 under the lip 21 as shown in FIG. 4.

The flexible strip 30, in the installed position, is deformed or compressed to approximately 60% of the undeformed width or a 40% compression. When compressed or deformed, the flexible strip 30 has a marginal edge surface 38 sealed against the lower surface of upper component 34 and a marginal edge surface 37 sealed against the upper surface of lower component 35 to effect the EMI seal to the space between adjoining components 34 and 35.

The flexible strip 30 also provides the biasing force the retain the upper arm edge 24 in the captured position in groove 22 beneath the lip 21. To provide a continuous biasing force it is required that the angle A between back panel 14 and lower arm 16 be an acute angle approaching a right angle. The length of upper arm 15 is related to the length of lower arm 16 to prevent the angle A from exceeding 90 degrees as the gasket assembly is placed in the operative condition by moving the upper arm edge over lip 21 to a position of capture thereunder.

Figure 5:
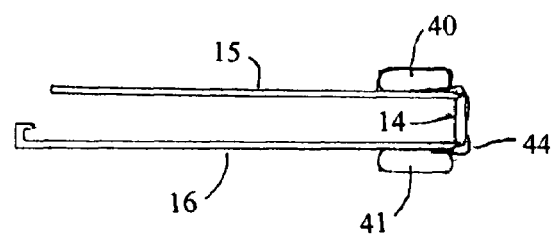
FIG. 5 is a side elevation of an alternate embodiment of the EMI gasket assembly of the present invention.
Figure 6:
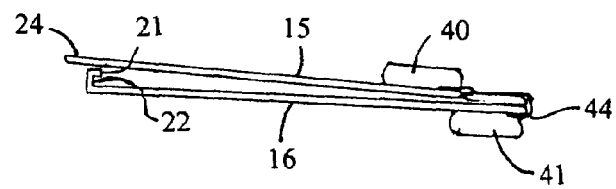
FIG. 6 is a side elevation of the gasket assembly of FIG. 5 in the collapsed position for insertion to an operative location.
Figure 7:
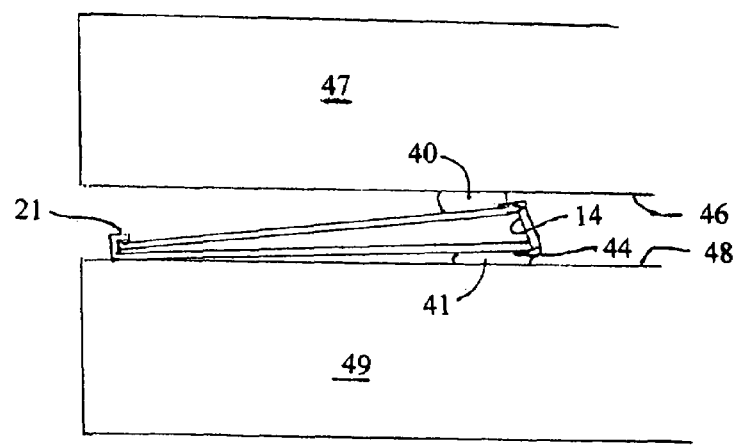
FIG. 7 is a side elevation of the gasket assembly of FIG. 5 showing the assembly in the operative position between confronting surfaces of adjoining devices.

A second embodiment of the invention is illustrated in FIGS. 5, 6 and 7. Using the carrier 12 of the preferred embodiment, the gasket material includes compressible strips 40 and 41 of foam material covered by a conductive fabric 44 which also extends between the foam strips and over the back panel 14 of carrier 12 to create a continuous conductive surface. FIG. 6, similar to FIG. 3, shows the assembly collapsed to a reduced height for insertion between confronting device surfaces that define a space requiring an EMI seal. In the operative condition of FIG. 7, the carrier is adjusted to the position wherein the upper arm marginal edge is captured in the groove 22 beneath lip 21. In this operative position, the upper and lower foam strips 40 and 41 are respectively compressed against the lower surface 46 of upper component 47 and the upper surface 48 of lower component 49.

Figure 8:
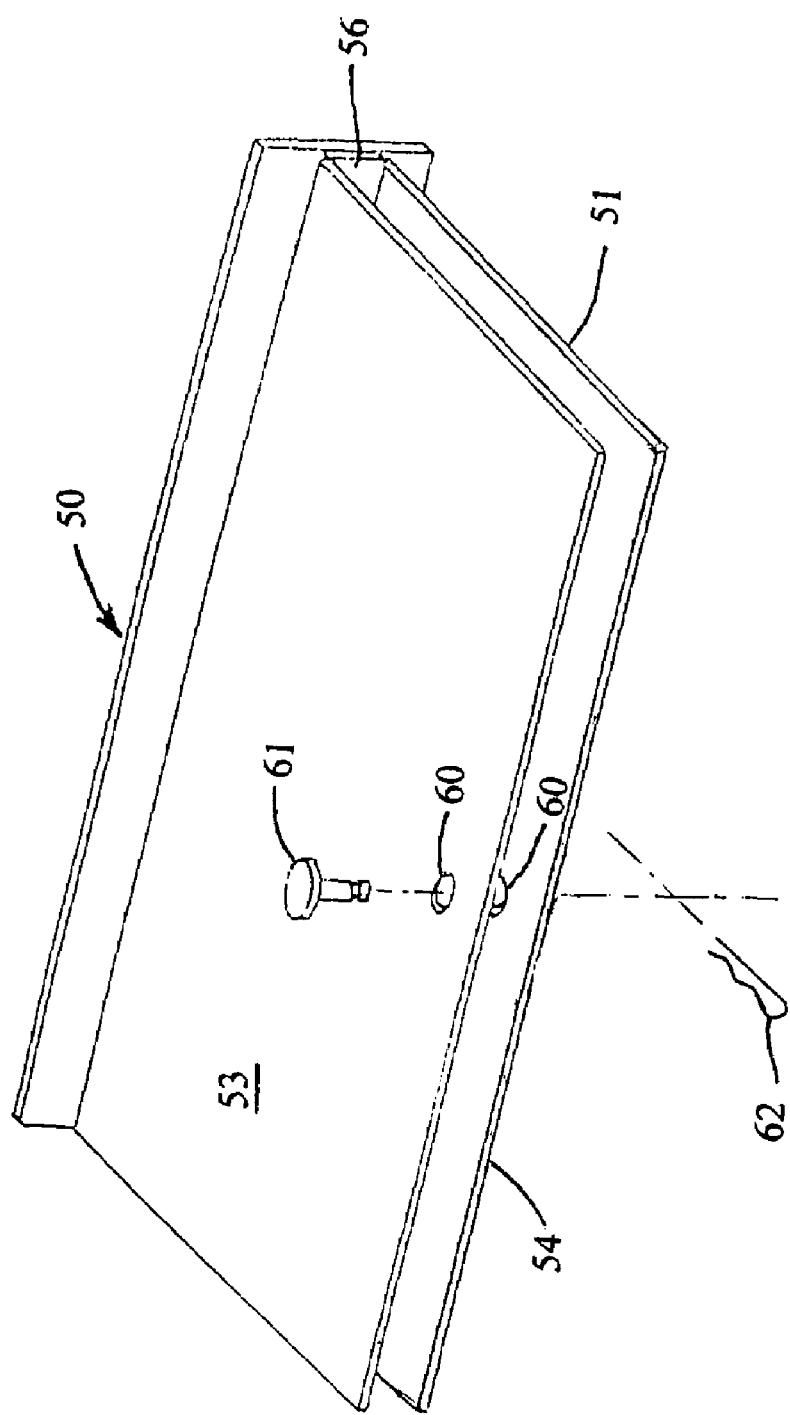
FIG. 8 is an EMI gasket assembly, similar to FIG. 1, which shows an alternate means for releasably fastening the carrier arms to one another in the operative position.

FIG. 8 illustrates a gasket assembly 50, similar to that of FIG. 1, which employs a modified carrier 51. Carrier 51 includes almost identical upper and lower arms 53 and 54, both having a hinge connection to back panel 56. The gasket 58, formed as a strip of deformable, resilient 5 material, is adhered to the rear wall surface of back panel 56. Each of the arms 53 and 54 have a central opening 60 adjacent the arm edge remote from the back panel 56. The gasket assembly 50 is collapsed for installation (similar to FIG. 3) by extending the upper arm 40 forward to cause the back panel 56 to overlie the lower arm 41. The assembly is placed in the operating position by moving the upper arm 40 relative to the lower arm 41 to align the openings 60. To retain the assembly in the operative position, a pin, bolt or other releasable fastener is inserted through the aligned openings 60 to maintain the relative position of the arms with respect to one another. For purposes of illustration, the releasable fastener is shown as a grooved pin 61 and clip 62, but any fastener structure could be utilized which can easily be connected and disconnected. When the gasket assembly 50 is used in an environment requiring frequent installation and removal, the carrier arms can be secured by a common twist tie inserted through the openings 60 and about the adjacent arm edges to secure the arms and removal can be effected by simply cutting the tie. Another releasable fastener for frequent installation and removal of the gasket assembly is the use of aligned hook and loop fastener portions attached to the confronting carrier arm surfaces using a carrier such as that shown in FIG. 8.

While the invention has been shown and described with reference to preferred embodiments thereof, it will be understood by those skilled in the art that various changes in form and details may be made therein without departing from the spirit and scope of the invention.

What is claimed is:

1. A gasket assembly for sealing against EMI radiation between two confronting surfaces comprising:

an elongated, deformable strip of electrically conductive material;

a carrier including upper and lower arms, each hingedly attached to an elongated back panel and extending from said back panel in the same direction and in overlying relation to one another;

said carrier back panel being attached longitudinally to said deformable strip along a midportion of a surface of said deformable strip;

said carrier having a first configuration wherein said back panel is pivoted to overlie said lower arm for insertion of aid assembly between confronting surfaces and a second configuration wherein said back panel forms an acute angle, approaching a right angle, with said lower arm; and means for releasably securing said upper arm to said lower arm when said carrier is disposed in said second configuration;

whereby, when said assembly, in said carrier first configuration, is inserted between confronting surfaces separated by a distance less than the width of said deformable strip and said carrier is moved to said second configuration, said deformable strip is deformed and compressed against said confronting surfaces to from an EMI seal along the length of the strip margins.

2. The gasket assembly of claim 1 wherein said elongated, deformable strip of electrically conductive material comprises a strip of compressible foam covered by a conductive layer.

3. The gasket assembly of claim 2 wherein said conductive layer is a woven nickel fabric.

4. The gasket assembly of claim 2 wherein said carrier comprises a single piece of plastic material that is formed as upper and lower arm portions each hingedly connected to said back panel by a reduced thickness connecting portion.

5. The gasket assembly of claim 2 wherein said releasable securing means comprises a lip and groove on one of said arms and edge of the other of said arms which is captured in said groove.

6. The gasket assembly of claim 5 wherein the said edge of the said other of said arms that is captured in the said groove in said one arm is biased into said groove by the force induced by deformation of said deformable strip of conductive material when said carrier is positioned in said second configuration.

7. The gasket assembly of claim 6 wherein said lip and groove are centrally interrupted and an opening is formed in the said other arm near the edge captured in said groove and aligned with the interruption in said lip and groove.

8. The gasket assembly of claim 2 wherein said releasable securing means comprises openings in each of said upper and lower arms which are aligned when said carrier is in said second configuration.

9. A gasket assembly for sealing against EMI radiation between two confronting, substantially parallel surfaces comprising:

a carrier including upper and lower arm members and a back panel with said arms having hinge connections to said back panel and extending in the same direction from said back panel to overlie one another;

an elongated, conductive gasket member secured to said carrier and extending the length of said back panel:

said carrier being movable between a first position wherein said back panel overlies one of said arms to reduce the height of said gasket assembly for installation between said confronting, substantially parallel surfaces and a second position whereat said back panel is pivoted to achieve near maximum separation of the arm portions adjacent the hinged connections to said back panel and to cause said gasket member to be moved into compressive EMI sealing engagement with said confronting, substantially parallel surfaces; and releasable securing means for securing said upper arm to said lower arm when said carrier is in said second position.

10. The gasket assembly of claim 9 wherein said upper and lower arms and said back panel are formed of a single piece of plastic material with the hinge connections of said arms with said back panel effected by reduced thickness portions at the connections between said back panel and said arms.

11. The gasket assembly of claim 10 wherein said elongated, conductive gasket member is an elongated strip of conductive, deformable material adhered to said back panel along a mid portion of a major surface thereof.

12. The gasket assembly of claim 11 wherein said strip of conductive, deformable gasket material is a strip of foam material with a continuous conductive coating.

13. The gasket assembly of claim 12 wherein said strip of foam material conductive coating comprises a woven nickel fabric.

14. The gasket assembly of claim 10 wherein said gasket member comprises a pair of strips of deformable foam material respectively attached to the surface of each of said arms adjacent the hinge connection with said back panel and on the surface facing away from the other of said arms and a continuous, conductive sheet that extends over each of said foam strips and continuously between said foam strips.

15. The gasket assembly of claim 14 wherein said conductive sheet is a woven, conductive metal fabric.

16. The gasket assembly of claim 9 wherein said releasable attachment means comprises a lip and groove formed on one of said arm members, with the edge of the other of said arm members distant from said hinge connection with said back panel captured in said groove when said carrier is in said second position with said gasket member deformed by sealing engagement with said confronting surfaces to bias said arm edge into said groove.

* * * * *